United States Patent
Ryu et al.

(10) Patent No.: US 9,508,452 B2
(45) Date of Patent: Nov. 29, 2016

(54) PARTIAL CHIP, AND SYSTEMS HAVING THE SAME

(71) Applicant: SAMSUNG ELECTRONICS CO., LTD., Suwon-si, Gyeonggi-do (KR)

(72) Inventors: Young Seok Ryu, Hwaseong-si (KR); Myeong O Kim, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/603,452

(22) Filed: Jan. 23, 2015

(65) Prior Publication Data

US 2015/0206573 A1 Jul. 23, 2015

(30) Foreign Application Priority Data

Jan. 23, 2014 (KR) .................. 10-2014-0008322

(51) Int. Cl.
| | |
|---|---|
| *G11C 7/12* | (2006.01) |
| *G11C 29/12* | (2006.01) |
| *G11C 29/08* | (2006.01) |
| *G11C 29/26* | (2006.01) |
| *G11C 29/30* | (2006.01) |
| *G11C 11/4076* | (2006.01) |
| *G11C 8/12* | (2006.01) |
| *G11C 7/10* | (2006.01) |
| *G11C 11/406* | (2006.01) |

(52) U.S. Cl.
CPC ............ *G11C 29/1201* (2013.01); *G11C 7/12* (2013.01); *G11C 11/4076* (2013.01); *G11C 29/08* (2013.01); *G11C 29/26* (2013.01); *G11C 29/30* (2013.01); *G11C 7/10* (2013.01); *G11C 8/12* (2013.01); *G11C 11/406* (2013.01)

(58) Field of Classification Search
CPC .................................. G11C 5/147; G11C 7/12
USPC ........................................ 365/189.07, 189.09
See application file for complete search history.

(56) References Cited

U.S. PATENT DOCUMENTS

| | | | |
|---|---|---|---|
| 6,741,940 B2 | 5/2004 | Mugibayashi et al. | |
| 7,095,670 B2 | 8/2006 | Lee et al. | |
| 2001/0043500 A1* | 11/2001 | Otsuka | G11C 7/1006 365/222 |
| 2003/0212517 A1* | 11/2003 | Liau | G01R 31/3004 702/82 |
| 2004/0230870 A1* | 11/2004 | Wang | G11C 29/56 714/30 |
| 2007/0130489 A1* | 6/2007 | Kiryu | G01B 31/318536 714/733 |
| 2011/0072205 A1 | 3/2011 | Lee et al. | |

FOREIGN PATENT DOCUMENTS

| | | |
|---|---|---|
| KR | 100192588 | 1/1999 |
| KR | 100228522 | 8/1999 |

* cited by examiner

*Primary Examiner* — Michael Tran
(74) *Attorney, Agent, or Firm* — F. Chau & Associates, LLC

(57) ABSTRACT

A partial chip and a system including the partial chip are provided. The partial chip includes a memory cell array and a signal control circuit. The memory cell array includes a pass region and a fail region. The signal control circuit is configured to generate second data corresponding to first data to be output from the fail region.

19 Claims, 17 Drawing Sheets

PARTIAL CHIP, AND SYSTEMS HAVING THE SAME

CROSS-REFERENCE TO RELATED APPLICATION

This application claims priority under 35 U.S.C. §119(a) to Korean Patent Application No. 10-2014-0008322, filed on Jan. 23, 2014, in the Korean Intellectual Property Office, the disclosure of which is incorporated by reference herein in its entirety.

TECHNICAL FIELD

The present inventive concept relates to a partial chip, and more particularly, to a partial chip including a signal control circuit for generating data corresponding to data to be output from a fail region of a memory cell array, and a system having the same.

DISCUSSION OF THE RELATED ART

A memory device includes a plurality of memory cells. When one of the memory cells is defective, the defective cell may no longer function as a data storage element. The memory device may configure the plurality of memory cells in blocks, and control a block including the defective cell to not be operated. In this case, the memory device may operate as a partial chip by using only the blocks that do not include the defective cells.

SUMMARY

According to an exemplary embodiment of the present inventive concept, a partial chip is provided. The partial chip includes a memory cell array and a signal control circuit. The memory cell array includes a pass region and a fail region. The signal control circuit is configured to generate second data corresponding to first data to be output from the fail region.

The signal control circuit may be configured to bypass third data output from the pass region to a data comparison circuit in the partial chip. The second data may be generated during a parallel bit test (PBT) operation. All of the second data may be set to one of a logic high and a logic low by using the signal control circuit.

The partial chip may further include a mode register including information on performance of the PBT operation.

The partial chip may be a dynamic random access memory (DRAM).

The partial chip may further include a partial chip control circuit. The partial chip control circuit may be configured to set the pass region to be a logic high and set the fail region to be a logic low.

According to an exemplary embodiment of the present inventive concept, a memory module may be provided. The memory module may include a printed circuit board (PCB) and a partial chip. The PCB may include a plurality of connection pins. The partial chip may be mounted on the PCB. The partial chip may include a memory cell array and a signal control circuit. The memory cell array may include a pass region and a fail region. The signal control circuit may be configured to generate second data corresponding to first data to be output from the fail region.

According to an exemplary embodiment of the present inventive concept, a system may be provided. The system may include a memory module, a memory module slot, and a processor. The memory module slot may be connected to the memory module. The processor may be electrically connected to the memory module slot. The processor may include a memory controller configured to control an operation of the partial chip. The memory module may include a printed circuit board (PCB) and a partial chip. The PCB may include a plurality of connection pins. The partial chip may be mounted on the PCB. The partial chip may include a memory cell array and a signal control circuit. The memory cell array may include a pass region and a fail region. The signal control circuit may be configured to generate second data corresponding to first data to be output from the fail region.

According to an exemplary embodiment of the present inventive concept, a system may be provided. The system may include a partial chip, a card interface, and a memory controller. The memory controller may be configured to control data exchange between the partial chip and the card interface. The partial chip may include a memory cell array and a signal control circuit. The memory cell array may include a pass region and a fail region. The signal control circuit may be configured to generate second data corresponding to first data to be output from the fail region.

According to an exemplary embodiment of the present inventive concept, a system is provided. The system includes a partial chip and a memory controller. The memory controller is configured to control an operation of the partial chip. The partial chip includes a memory cell array and a signal control circuit. The memory controller cell array includes a pass region and a fail region. The signal control circuit is configured to generate second data corresponding to first data to be output from the fail region. The signal control circuit is configured to bypass third data output from the pass region to a data comparison circuit in the system. The signal control circuit is configured to set all of the second data to be one of a logic high and a logic low during a parallel bit test (PBT) operation.

The memory controller may be embodied inside an application processor.

The system may be a smart phone, a tablet personal computer, or a wearable computer.

According to an exemplary embodiment of the present inventive concept, a partial chip is provided. The partial chip includes a first bank, a signal control circuit, and a data comparison circuit. The first bank includes a pass sub block and a fail sub block. The signal control circuit is configured to generate second data corresponding to first data to be output from the fail sub block during a parallel bit test (PBT) operation, to output the generated second data to a data comparison circuit, and to bypass third data from the pass sub block to the data comparison circuit. The data comparison circuit is configured to compare the second data with third data, and to output one of the second and third data according to the comparison result to an output driver of the partial chip.

The partial chip may further include a control logic. The control logic may be configured to select the first bank as a bank on which the PBT operation is performed.

The partial chip may further include a partial chip control circuit. The partial chip control circuit may be configured to set the pass sub block to be a logic high and the fail sub block to be a logic low.

BRIEF DESCRIPTION OF THE DRAWINGS

The above and other features of the present inventive concept will become more apparent by describing in detail exemplary embodiments thereof with reference to the attached drawings in which.

DETAILED DESCRIPTION OF THE EMBODIMENTS

Figure 1:
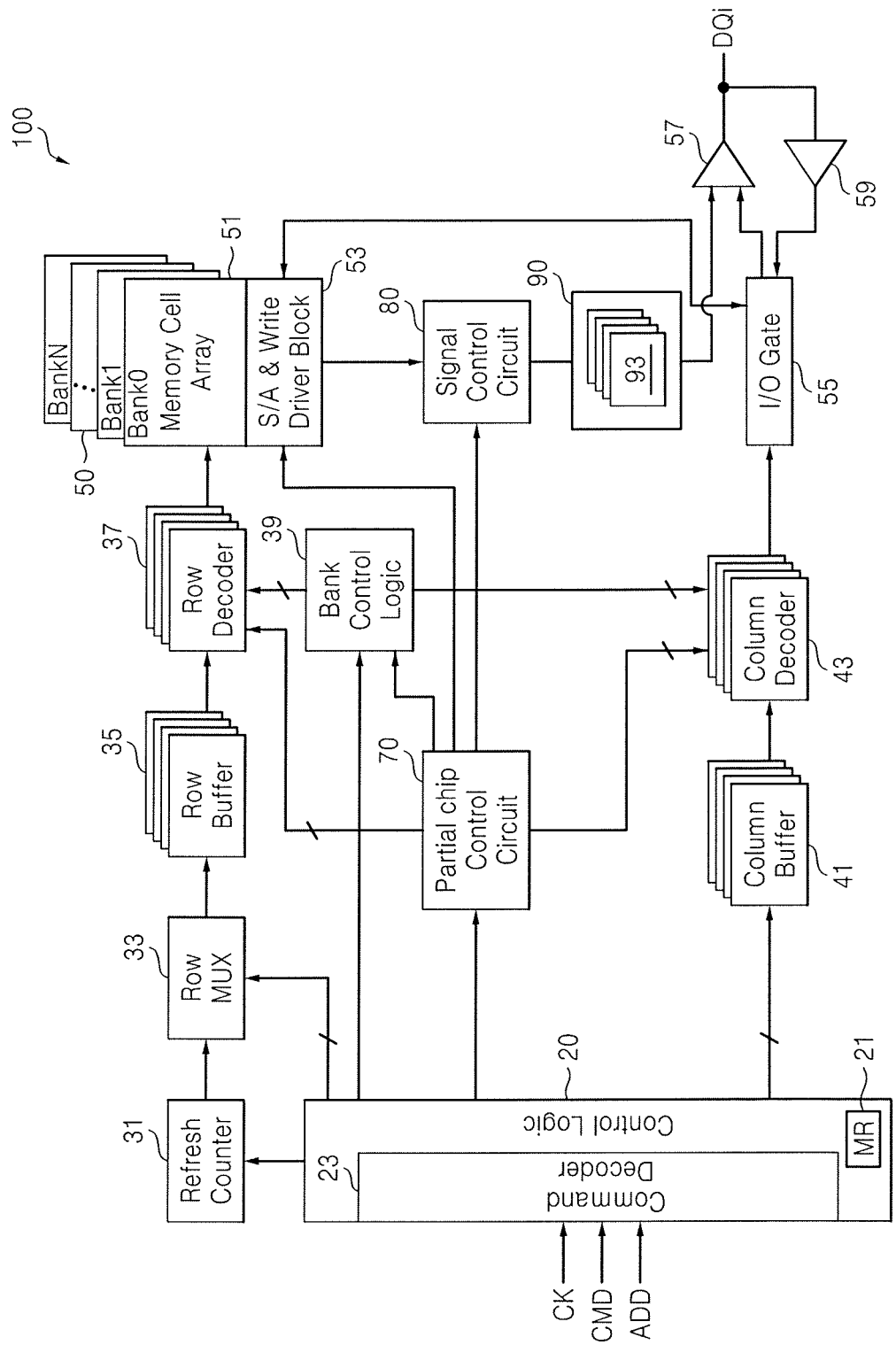
FIG. 1 is a block diagram of a memory device according to an exemplary embodiment of the present inventive concept.

The present inventive concept now will be described more fully hereinafter with reference to the accompanying drawings, in which exemplary embodiments thereof are shown. This present inventive concept may, however, be embodied in many different forms and should not be construed as limited to the embodiments set forth herein. In the drawings, the size and relative sizes of layers and regions may be exaggerated for clarity. Like numbers may refer to like elements throughout the specification and drawings.

It will be understood that when an element is referred to as being "connected" or "coupled" to another element, it can be directly connected or coupled to the other element or intervening elements may be present.

As used herein, the singular forms "a", "an" and "the" are intended to include the plural forms as well, unless the context clearly indicates otherwise.

FIG. 1 is a block diagram of a memory device according to an exemplary embodiment of the present inventive concept. Referring to FIG. 1, a memory device 100 may be embodied in a dynamic random access memory (DRAM), however the present inventive concept is not limited thereto. The memory device 100 may be an integrated circuit, a die, a chip, or the like.

The memory device 100 may include a control logic 20, a refresh counter 31, a row multiplexer 33, a plurality of row buffers 35, a plurality of row decoders 37, a bank control logic 39, a plurality of column buffers 41, a plurality of column decoders 43, a plurality of banks 50, an input/output gate 55, an output driver 57, an input buffer 59, a partial chip control circuit 70, a signal control circuit 80, and a data comparison circuit 90.

Each of the plurality of banks 50, which is labeled as Bank0 to BankN, may include a memory cell array 51. The memory cell array 51 includes a plurality of word lines (or row lines), a plurality of bit lines (or column lines), and a plurality of memory cells for storing data. The memory cell array 51 of each of the plurality of banks 50 may include a pass region and a fail region including at least one fail cell.

The "Fail Cell" may be a defective memory cell or a memory cell whose AC characteristics, such as a row address strobe (RAS)-to-column address strobe (CAS) Delay Time (tRCD), a RAS Precharge Time (tRP), a CAS Precharge Time (tCP), or the like for a memory cell, are relatively bad.

A memory access operation, e.g., a read operation or a write operation, may be performed in the pass region according to a control of the control logic 20 and/or the partial chip control circuit 70. The memory access operation may not be performed in the fail region.

For example, the partial chip control circuit 70 may perform a function of selecting a partial chip region to distinguish between the pass region and the fail region. For example, the partial chip control circuit 70 may set pass regions among entire partial regions to a logic high using partial chip control signals, and set fail regions among the entire partial regions to a logic low. According to an exemplary embodiment of the present inventive concept, regions actually driven in a partial chip are controlled to be a logic high, and regions not driven in the partial chip are controlled to be a logic low. Accordingly, data may not be read or written from/in a plurality of memory cells included in the fail region by the memory access operation.

According to an exemplary embodiment of the present inventive concept, the fail region and the pass region may be a bank or a sub block included in the bank. For example, the memory device 100 may be a partial chip. For example, the partial chip may be a semiconductor chip which may process data using blocks (e.g., the pass region) except for a block (e.g., the fail region) including a defective cell.

For convenience of description, it is illustrated that each of the plurality of banks 50 is embodied in a different layer, however, the present inventive concept should not be limited by a structure and layout of the plurality of banks 50.

Figure 2:
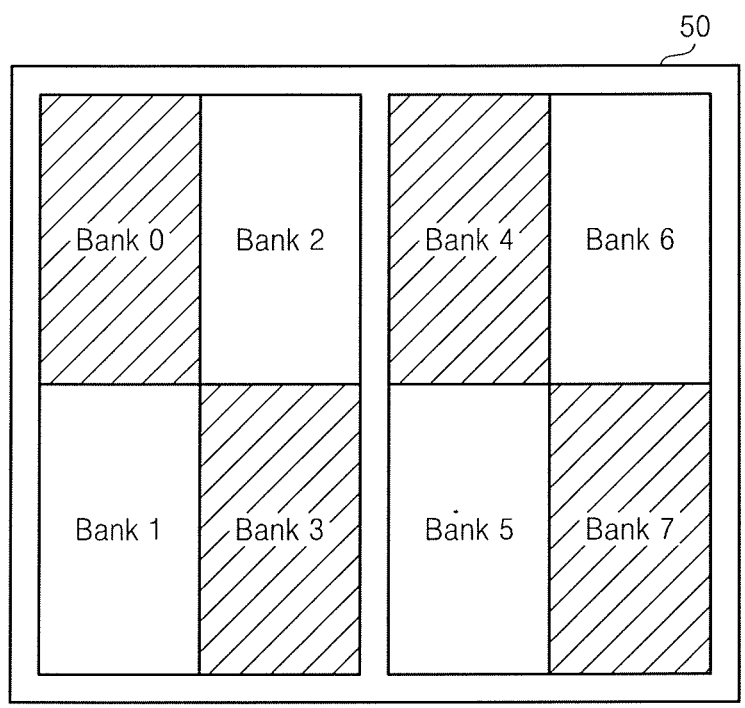
FIG. 2 illustrates a configuration of a plurality of banks of the memory device illustrated in FIG. 1 according to an exemplary embodiment of the present inventive concept.
Figure 3:
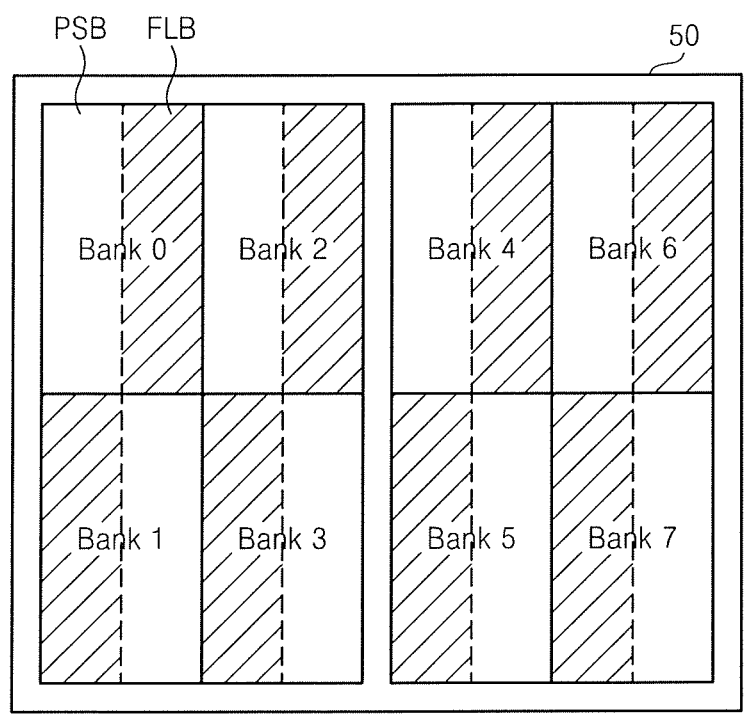
FIG. 3 illustrates a configuration of a plurality of banks of the memory device illustrated in FIG. 1 according to an exemplary embodiment of the present inventive concept.
Figure 4:
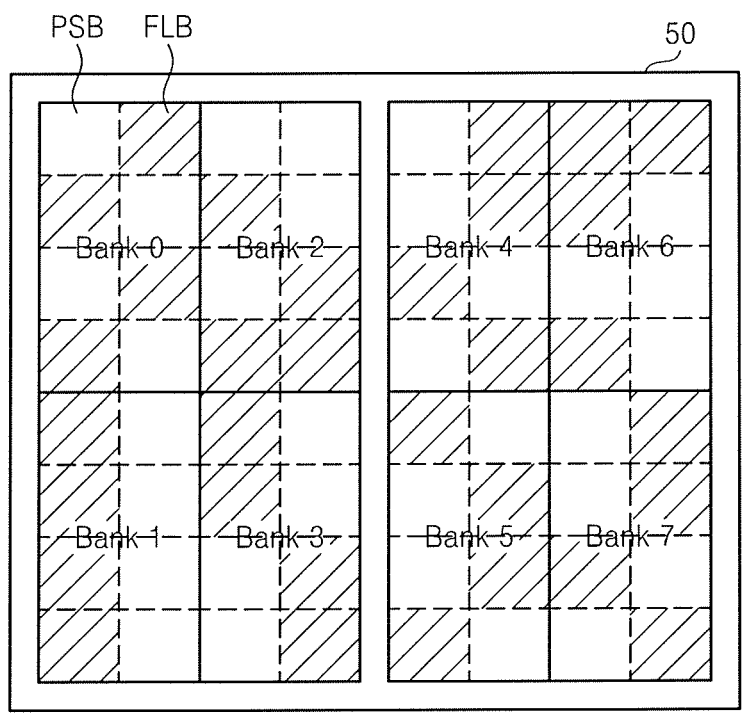
FIG. 4 illustrates a configuration of a plurality of banks of the memory device illustrated in FIG. 1 according to an exemplary embodiment of the present inventive concept.

FIG. 2 illustrates a configuration of a plurality of banks of the memory device illustrated in FIG. 1 according to an exemplary embodiment of the present inventive concept, FIG. 3 illustrates a configuration of a plurality of banks of the memory device illustrated in FIG. 1 according to an exemplary embodiment of the present inventive concept, and FIG. 4 illustrates a configuration of a plurality of banks of the memory device illustrated in FIG. 1 according to an exemplary embodiment of the present inventive concept.

For convenience of description, it is illustrated that the configuration of the plurality of banks 50 illustrated in FIGS. 2 to 4 includes eight banks, however, the number of the plurality of banks 50 is not limited thereto. Referring to FIGS. 1 and 2, the plurality of banks 50 may include pass banks Bank1, Bank2, Bank5, and Bank6 and fail banks Bank0, Bank3, Bank4, and Bank7. For example, the pass banks Bank1, Bank2, Bank5, and Bank6 are banks which are processed to be a logic high by the partial chip control circuit 70, and the fail banks Bank0, Bank3, Bank4, and Bank7 are banks which are processed to be a logic low by the partial chip control circuit 70.

A memory access operation (e.g., a read operation or a write operation) may not be performed on the fail banks Bank0, Bank3, Bank4, and Bank7 according to a control of the control logic 20 and/or the partial chip control circuit 70. For example, data may not be read or written from/in a plurality of memory cells included in the fail banks Bank0, Bank3, Bank4, and Bank7 by the memory access operation.

A fail region including at least one fail cell may be configured on a bank basis as illustrated in FIG. 2.

Referring to FIGS. 1, 3, and 4, each of the plurality of banks Bank0 to Bank7 may include one or more pass sub blocks PSB and one or more fail sub blocks FLB. For example, the pass sub blocks PSB are sub blocks processed to be a logic high by the partial chip control circuit 70, and the fail sub blocks FLB are sub blocks processed to be a logic low by the partial chip control circuit 70.

For example, the partial chip control circuit 70 may process a memory region which does not include a defective cell or a fail cell to be a pass memory region (e.g., the pass sub block PSB), and process a memory region including the defective cell or the fail cell to be a fail memory region (e.g., the fail sub block FLB). For example, the memory region may be a region including a bank, a sub block, or a plurality of memory cells. Accordingly, each of the plurality banks Bank0 to Bank7 may include two memory regions as illustrated in FIG. 3, or eight memory regions as illustrated in FIG. 4. However, the present inventive concept is not limited thereto.

A memory access operation may not be performed on each sub block FLB corresponding to a fail region included in each of the plurality of banks Bank0 to Bank7 according to a control of the control logic 20 and/or the partial chip control circuit 70. For example, data may not be read or written from/in a plurality of memory cells included in each sub block FLB corresponding to the fail region included in each of the plurality of banks Bank0 to Bank7.

Referring to FIGS. 1 to 4, the control logic 20 may control each configuration element 31, 33, 39, 41, and 70 in response to a plurality of signals, e.g., a clock signal CK, a command signal CMD, and an address signal ADD.

The command signal CMD may be generated by combining a plurality of commands, e.g., chip select (CS), RAS, CAS, and/or write enable (WE). According to an exemplary embodiment of the present inventive concept, the command signal CMD may be transmitted from a memory controller (not shown). The address signal ADD may include address information on an object of an operation, e.g., a parallel bit test (PBT) operation.

For example, the address information may include address information of a bank, address information of a sub block included in the bank, and/or address information of a memory cell included in the bank or the sub block.

The address information on banks or sub blocks may not be input from outside of the memory device 100, and may be generated inside the memory device 100 according to information set in a mode register 21. However, the present inventive concept is not limited thereto.

The control logic 20 may include a mode register 21 and a command decoder 23. The mode register 21 may include information for controlling various operation modes of the memory device 100, e.g., a normal memory access operation mode, a PBT operation mode, a refresh operation mode, or the like. The command decoder 23 may decode a command signal CMD, which is determined by combining a plurality of commands, e.g., CS, RAS, CAS, and/or WE, based on the clock signal CK, and generate a command and/or an address for controlling each configuration element 31, 33, 39, 41, and 70 according to a result of the decoding.

According to an exemplary embodiment of the present inventive concept, the command decoder 23 may be embodied outside of the control logic 20, but the present inventive concept is not limited thereto. According to an exemplary embodiment of the present inventive concept, the command decoder 23 may decode a command signal CMD and generate a PBT operation command for performing a PBT operation.

The refresh counter 31 may generate a row address in response to a refresh command output from the command decoder 23. The row multiplexer 33 may select one of a row address generated by the refresh counter 31 and a row address output from the control logic 20 in response to a selection signal (not shown).

According to an exemplary embodiment of the present inventive concept, when performing a PBT operation or a normal memory access operation (for example, a read operation or a write operation), the row multiplexer 33 may output the row address output from the control logic 20. According to an exemplary embodiment of the present inventive concept, when performing a refresh operation, the row multiplexer 33 may output the row address generated by the refresh counter 31.

Each of the plurality of row buffers 35 may buffer the row address output from the row multiplexer 33. According to an exemplary embodiment of the present inventive concept, the plurality of row buffers 35 may be embodied in one row buffer, however, the present inventive concept is not limited thereto. A particular row decoder corresponding to a bank selected by the bank control logic 39 among the plurality of row decoders 37 may decode a row address output from a particular row buffer corresponding to the bank among the plurality of row buffers 35. According to an exemplary embodiment of the present inventive concept, the plurality of row decoders 37 may be embodied in one row decoder, however, the present inventive concept is not limited thereto.

The bank control logic 39 may select one or more banks for performing the PBT operation among the plurality of banks 50 according to a control of the control logic 20. According to an exemplary embodiment of the present inventive concept, the control logic 20 may select one or more banks for performing the PBT operation among the plurality of banks 50.

Each of the plurality of column buffers 41 may buffer a column address output from the control logic 20. According to an exemplary embodiment of the present inventive concept, the plurality of column buffers 41 may be embodied in one column buffer, however, the present inventive concept is not limited thereto.

A particular column decoder corresponding to a bank selected by the bank control logic 39 among the plurality of column decoders 43 may decode a column address output from a particular column buffer corresponding to the bank among the plurality of column buffers 41. According to an exemplary embodiment of the present inventive concept, the plurality of column decoders 43 may be embodied in one column decoder, however, the present inventive concept is not limited thereto.

The partial chip control circuit 70 may control each configuration element 37, 39, 43, 53, and 80 according to a command and/or an address output from the command decoder 23. The partial chip control circuit 70 may disable an operation of each configuration element 37, 39, 43, and 53 corresponding to a fail region, e.g., a bank or a sub block included in the bank.

Each of the plurality of banks 50 may further include a sense amplifier and write driver block 53.

The sense amplifier and write driver block 53 may operate as a sense amplifier which senses and amplifies a change in voltage of each bit line when the memory device 100 performs a read operation. The sense amplifier and write driver block 53 may output output data to the input/output gate 55 or the signal control circuit 80 according to a control of the control logic 20 and/or the partial chip control circuit 70.

According to an exemplary embodiment of the present inventive concept, when performing the PBT operation, the sense amplifier and write driver block 53 may output the output data to the signal control circuit 80. According to an exemplary embodiment of the present inventive concept, when performing a normal memory access operation, e.g., a read operation or a write operation, the sense amplifier and write driver block 53 may output the output data to the input/output gate 55.

The signal control circuit 80 may operate according to a control of the partial chip control circuit 70. The signal control circuit 80 may generate second data corresponding to first data to be output from a fail region of the memory cell array 51. In addition, the signal control circuit 80 may bypass third data output from a pass region of the memory cell array 51 to, for example, the data comparison circuit 90.

For example, since the first data cannot be output from the fail region by the partial chip control circuit 51, the signal control circuit 80 may compulsorily generate the second data corresponding to the first data. According to an exemplary embodiment of the present inventive concept, the second data may be generated during the PBT operation. For example, the signal control circuit 80 may bypass data output from a pass region to the data comparison circuit 90, and compulsorily process all data corresponding to a fail region to be a logic high (or logic low).

As all of the data corresponding to the fail region are set to a logic high (or logic low) from an unknown state by the signal control circuit 80 according to an exemplary embodiment of the present inventive concept, a partial chip may use a PBT mode. Accordingly, a test time for the partial chip may be shortened and a current consumed in the partial chip may be decreased.

The data comparison circuit 90 may compare the second data with the third data, and output one of the second and third data according to the comparison result to the output driver 57. The data comparison circuit 90 may include one or more comparison circuits 93 for comparing the second data with the third data.

The input/output gate 55 may transmit data or signals output from the sense amplifier and light driver block 53 to the output driver 57 in response to a column selection signal output from one of the plurality of column decoders 43. According to an exemplary embodiment of the present inventive concept, the input/output gate 55 may transmit data or signals input through the input buffer 59 to the sense amplifier and light driver block 53 in response to the column selection signal.

The output driver 57 may output data or signals transmitted from the input/output gate 55 or the data comparison circuit 90 to the outside of the memory device 100. According to an exemplary embodiment of the present inventive concept, the output driver 57 may output the output data transmitted from the data comparison circuit 90 to a test circuit (not shown) which is connected to the memory device 100 during the PBT operation. The input buffer 59 may transmit data or signals input from the outside of the memory device 100 to the input/output gate 55.

Figure 5:
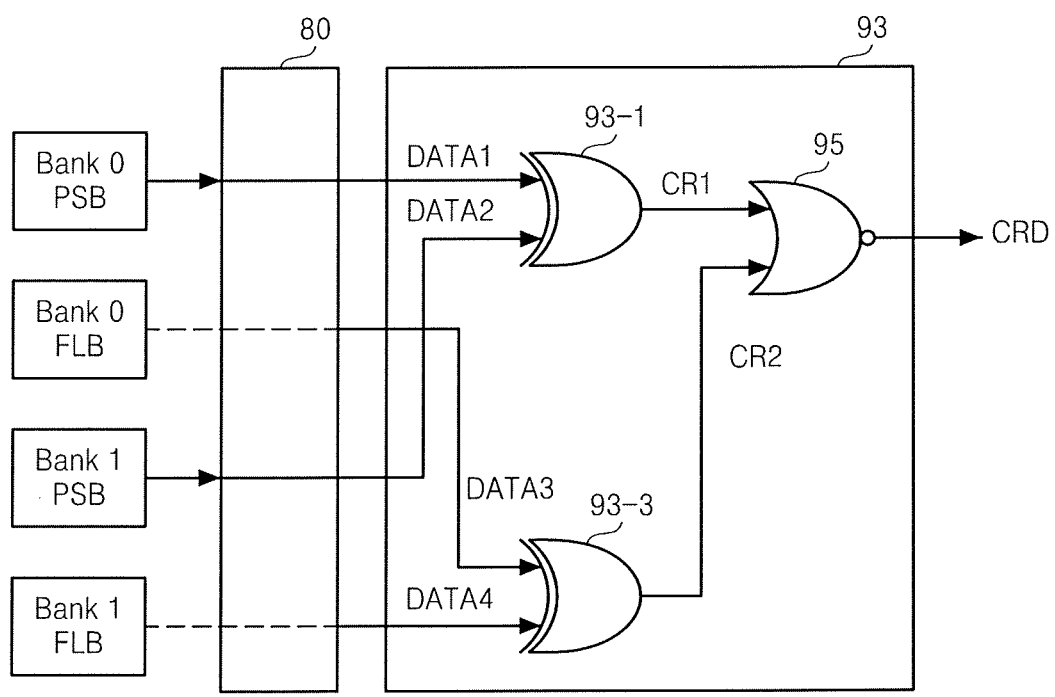
FIG. 5 is a block diagram illustrating a method of operating a signal control circuit illustrated in FIG. 1 during a parallel bit test (PBT) operation according to an exemplary embodiment of the present inventive concept.

FIG. 5 is a block diagram illustrating a method of operating a signal control circuit illustrated in FIG. 1 during a PBT operation according to an exemplary embodiment of the present inventive concept. Referring to FIGS. 1, 3, and 5, only a bank Bank0 and a bank Bank1 are illustrated as objects of the PBT operation for convenience of description, however the present inventive concept is not limited thereto.

When the PBT operation is performed, data DATA1 and DATA2 each of which is output from each pass sub block PSB of the banks Bank0 and Bank1 may be transmitted to the signal control circuit 80 through the sense amplifier and light driver block 53. When the PBT operation is performed, data to be output from each fail sub block FLB of the banks Bank0 and Bank1 may not be transmitted to the signal control circuit 80 through the sense amplifier and light driver block 53.

The signal control circuit 80 may bypass the data DATA1 and DATA2 output from each pass sub block PSB of the banks Bank0 and Bank1 to the comparison circuit 93. In addition, the signal control circuit 80 may generate data DATA3 and DATA4 each of which corresponds to the data to be output from each fail sub block FLB of the banks Bank0 and Bank1, and transmit the generated data DATA3 and DATA4 to the comparison circuit 93. According to an exemplary embodiment of the present inventive concept, the signal control circuit 80 may set both DATA3 and DATA4 to be one of a logic high and a logic low. According to an exemplary embodiment of the present inventive concept, the data DATA3 and data DATA4 may be the same as each other.

The comparison circuit 93 may compare between the data DATA1 to DATA4, and output data CRD according to a result of the comparison. The comparison circuit 93 may include a plurality of exclusive-OR gates 93-1 and 93-3, and a NOR gate 95.

The exclusive-OR gate 93-1 may perform an exclusive-OR operation on the data DATA1 and DATA2, and transmit a result data CR1 of the operation to the NOR gate 95. The exclusive-OR gate 93-3 may perform an exclusive-OR operation on the data DATA3 and DATA4, and transmit a result data CR2 of the operation to the NOR gate 95.

The NOR gate 95 may perform a NOR operation on the data CR1 and CR2, and output the data CRD according to a result of the NOR operation. Accordingly, the memory device 100 compulsorily generates data (e.g., the data DATA3 and DATA4) corresponding to data to be output from a fail region and thus, the PBT operation is performed. For example, the memory device 100 may shorten a test time, and accordingly a test cost may be reduced.

Figure 6:
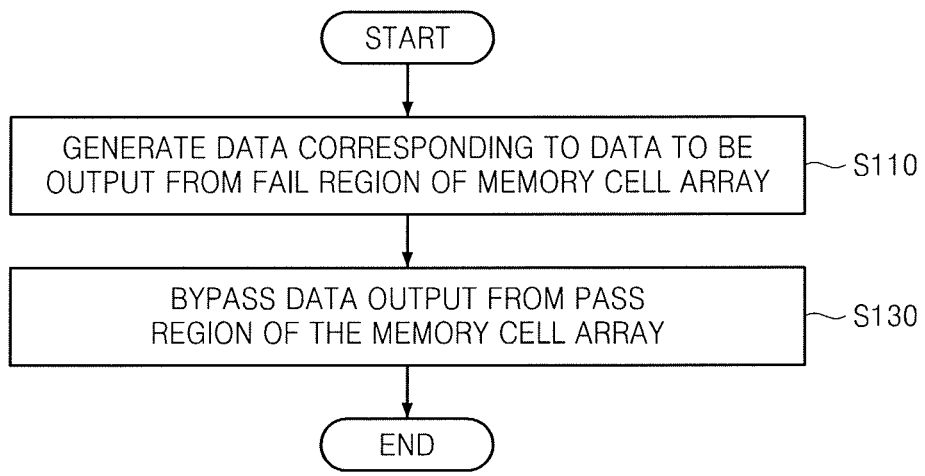
FIG. 6 is a flowchart illustrating a method of operating a memory device according to an exemplary embodiment of the present inventive concept.

FIG. 6 is a flowchart illustrating a method of operating a memory device according to an exemplary embodiment of the present inventive concept. Referring to FIGS. 1 to 6, when the PBT operation is performed, the signal control circuit 80 may generate data corresponding to data to be output from a fail region of a memory cell array (S110). The signal control circuit 80 may bypass data output from a pass region of the memory cell array (S130).

Figure 7:
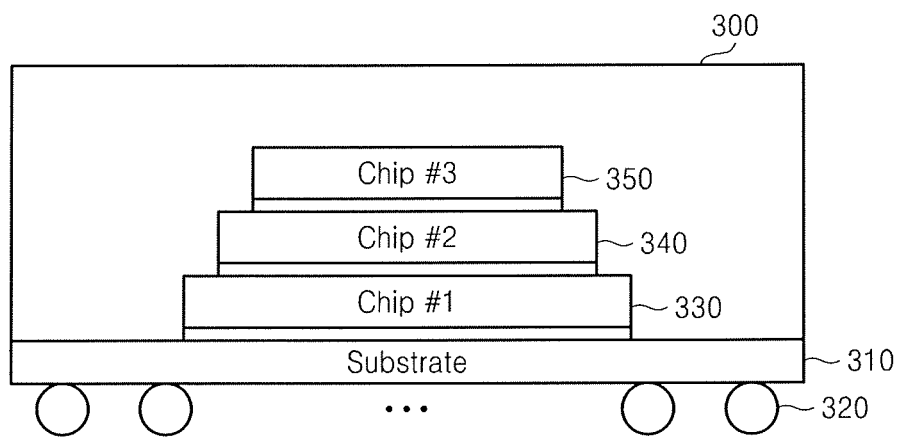
FIG. 7 is a diagram illustrating a package including the memory device illustrated in FIG. 1 according to an exemplary embodiment of the present inventive concept.

FIG. 7 is a diagram illustrating a package including the memory device illustrated in FIG. 1 according to an exemplary embodiment of the present inventive concept. Referring to FIGS. 1 and 7, a package 300 may include a plurality of semiconductor devices 330, 340, and 350 successively stacked on a package substrate 310. A structure of each of the plurality of semiconductor devices 330, 340, and 350 may be substantially the same as a structure of the memory device 100.

The package 300 may be embodied in a Package on Package (PoP), Ball Grid Arrays (BGAs), Chip Scale Packages (CSPs), a Plastic Leaded Chip Carrier (PLCC), a Plastic Dual In-Line Package (PDIP), a Chip On Board (COB), CERamic Dual In-Line Package (CERDIP), a plastic metric quad flat pack (MQFP), a Thin Quad Flat Pack (TQFP), a small-outline integrated circuit (SOIC), a shrink small outline package (SSOP), a thin small outline (TSOP), a system in package (SIP), a multi chip package (MCP), a wafer-level package (WLP), a wafer-level processed stack package (WSP), or the like.

According to an exemplary embodiment of the present inventive concept, a memory controller (not shown) may be embodied in one or more of the plurality of semiconductor devices 330, 340, and 350. In an exemplary embodiment of the present inventive concept the memory controller may be embodied on the package substrate 310.

For an electrical connection among the plurality of semiconductor devices 330, 340, and 350, one or more electrical vertical connection means, e.g., Through-silicon via (TSV), may be used.

The package 300 may be embodied in a Hybrid Memory Cube (hereinafter, referred to as "HMC") including a memory controller and a memory cell array die which are stacked on each other. As the package 300 is embodied in the HMC, a performance of a memory device may be increased due to an increased bandwidth, and a power consumption and manufacturing cost may be reduced due to a minimized area occupied by the memory device.

Figure 8:
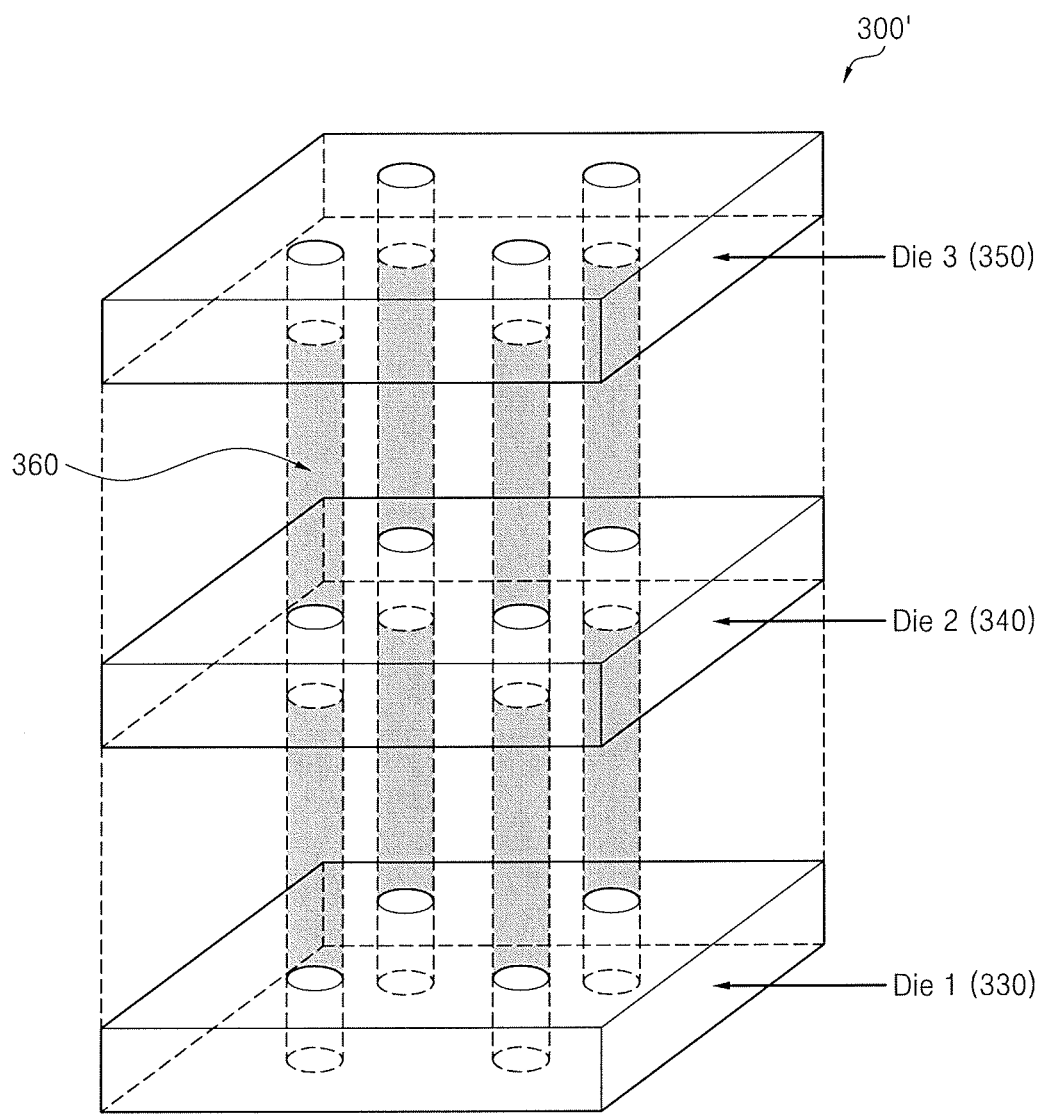
FIG. 8 is a three-dimensional diagram illustrating a package including the memory device illustrated in FIG. 1 according to an exemplary embodiment of the present inventive concept.

FIG. 8 is a three-dimensional diagram illustrating a package including the memory device illustrated in FIG. 1 according to an exemplary embodiment of the present inventive concept. Referring to FIGS. 1, 7, and 8, a package 300' may include a plurality of dies 330, 340, and 350 stacked each other through each TSV 360.

Figure 9:
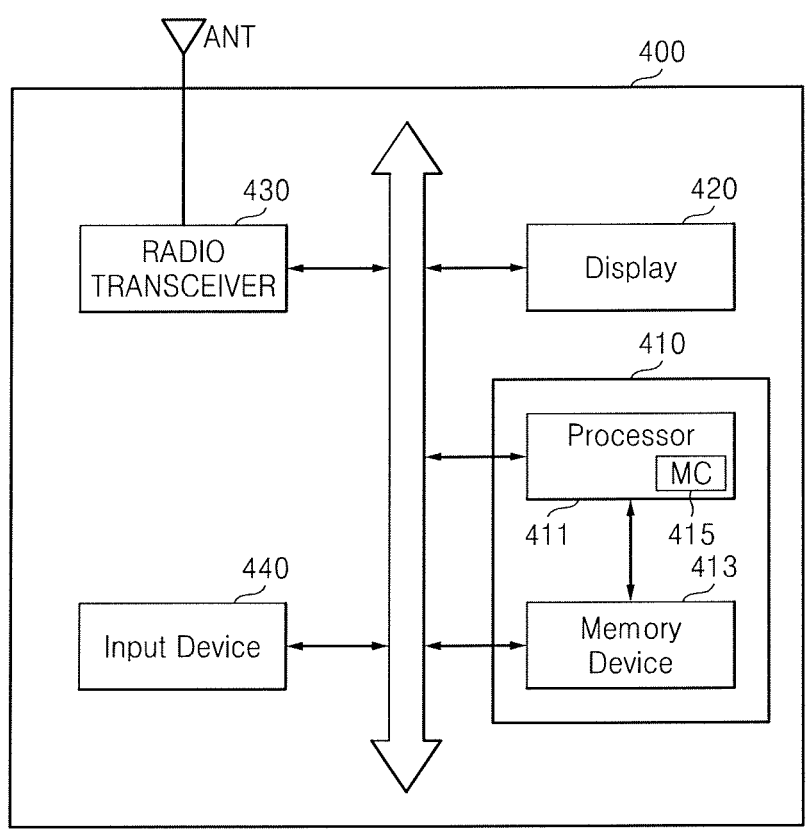
FIG. 9 is a block diagram of a system including the memory device illustrated in FIG. 1 according to an exemplary embodiment of the present inventive concept.

FIG. 9 is a block diagram of a system including the memory device illustrated in FIG. 1 according to an exemplary embodiment of the present inventive concept. Referring to FIGS. 1, 7, 8, and 9, a system 400 may be embodied in an electronic device or a portable electronic device.

The portable electronic device may be embodied in a laptop computer, a mobile phone, a smart phone, a tablet personal computer (PC), a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID) an e-book, or the like.

The system 400 may include a processor 411 and a memory device 413. The memory device 413 may be the memory device 100 of FIG. 1. According to an exemplary embodiment of the present inventive concept, the processor 411 and the memory device 413 may be packaged in a single package 410. In this case, the package 410 may be mounted on a system board (not shown). The package 410 may be the package 300 illustrated in FIG. 7 or a package 300' illustrated in FIG. 8.

The processor 411 may include a memory controller 415 which may control a data processing operation, e.g., a write operation or a read operation, of the memory device 413. The memory controller 415 may be controlled by the processor 411 which controls an operation of the system 400. According to an exemplary embodiment of the present inventive concept, the memory controller 415 may be connected between the processor 411 and the memory device 413 as an additional chip.

Data stored in the memory device 413 may be displayed on a display 420 through a display controller according to a control of the processor 411. The radio transceiver 430 may transmit or receive a radio signal through an antenna ANT. For example, the radio transceiver 430 may convert the radio signal received through the antenna ANT into a signal which can be processed by the processor 411. Accordingly, the processor 411 may process a signal output from the radio transceiver 430, and store the processed signal in the memory device 413 or display the processed signal through the display 420.

The radio transceiver 430 may convert a signal output from the processor 411 into a radio signal, and output the converted radio signal to outside through the antenna ANT.

The input device 440 may be embodied in a device which may input a control signal for controlling an operation of the processor 411 or data to be processed by the processor 41. For example, the input device 440 may be embodied in a pointing device such as a touch pad, a computer mouse, a keypad, a keyboard, or the like.

The processor 411 may control the display 420 so that data output from the memory device 413, a radio signal output from the radio transceiver 430, or data output from the input device 440 may be displayed through the display 420.

Figure 10:
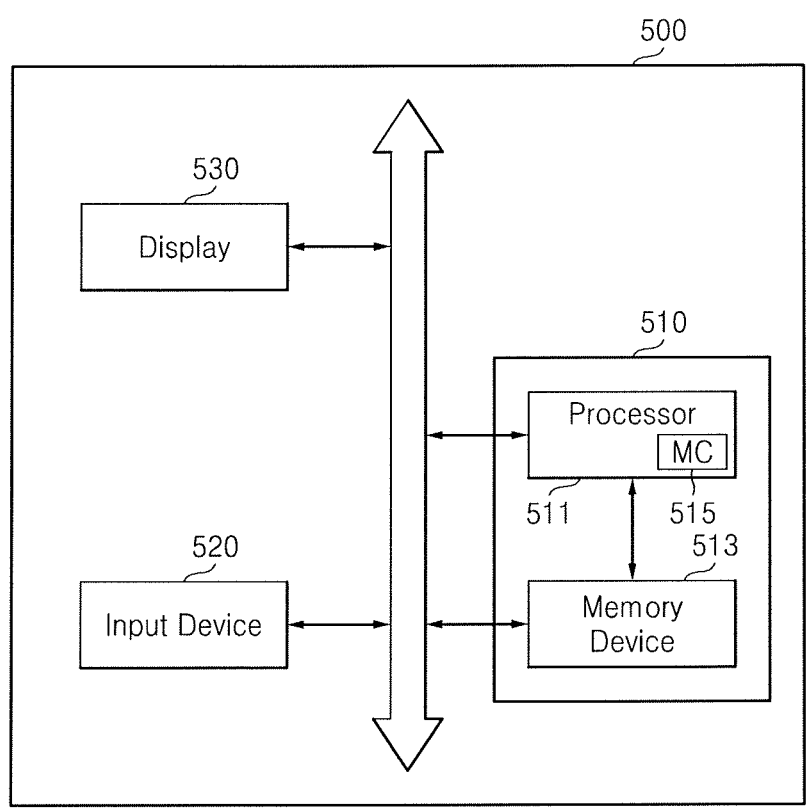
FIG. 10 is a block diagram of a system including the memory device illustrated in FIG. 1 according to an exemplary embodiment of the present inventive concept.

FIG. 10 is a block diagram of a system including the memory device illustrated in FIG. 1 according to an exemplary embodiment of the present inventive concept. Referring to FIGS. 1, 7, 8, and 10, a system 500 may be embodied in a PC, a tablet PC, a laptop computer, a PDA, a PMP, a MP3 player, a MP4 player, a wearable computer, or the like.

The system 500 may include a processor 511 for controlling an entire operation of the system 500 and a memory device 513. The memory device 513 may be the memory device 100 illustrated in FIG. 1. According to an exemplary embodiment of the present inventive concept, the processor 511 and the memory device 513 may be packaged in a single package 510. The package 510 may be mounted on a system board (not shown). The package 510 may be the package 300 illustrated in FIG. 7 or the package 300' illustrated in FIG. 8.

The processor 511 may include a memory controller 515 which controls an operation of the memory device 513. The processor 511 may display data stored in the memory device 513 through the display 530 according to an input signal generated by the input device 520. For example, the input device 520 may be embodied in a pointing device such as a touch pad, a computer mouse, a keypad, a touch panel, a keyboard, or the like.

Figure 11:
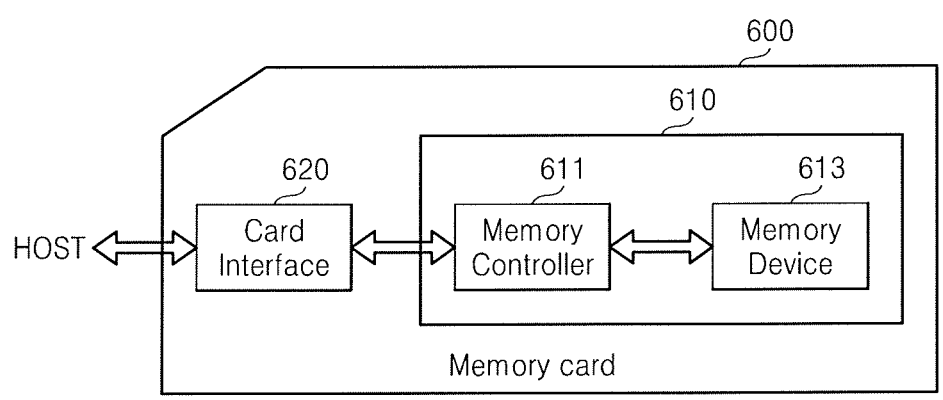
FIG. 11 is a block diagram of a system including the memory device illustrated in FIG. 1 according to an exemplary embodiment of the present inventive concept.

FIG. 11 is a block diagram of a system including the memory device illustrated in FIG. 1 according to an exemplary embodiment of the present inventive concept. Referring to FIGS. 1, 7, 8, and 11, a system 600 may be embodied in a memory card, a smart card, a universal serial bus (USB) flash drive, a universal flash storage (UFS), or the like.

The system 600 may include a memory device 613, a memory controller 611, and/or a card interface 620. The memory device 613 may be the memory device 100 illustrated in FIG. 1. According to an exemplary embodiment of the present inventive concept, the memory device 613 and the memory controller 611 may be packaged in a single package 610. The system 600 may be connected to a host. The package 610 may be the package 300 illustrated in FIG. 7, or the package 300' illustrated in FIG. 8.

The memory controller 611 may control data exchange between the memory device 613 and the card interface 620. According to an exemplary embodiment of the present inventive concept, the card interface 620 may be a secure digital (SD) card interface, a multimedia card (MMC) interface, an embedded-MMC (eMMC) interface, a UFS interface, or the like, however, the present inventive concept is not limited thereto.

The card interface 620 may interface data exchange between the host and the memory controller 611 according to a protocol of the host.

When the system 600 is connected to a host such as a smart phone, a tablet PC, a computer, a digital camera, a digital audio player, a console video game hardware, a MID, a vehicle blackbox, or a digital set-top box, the host may transmit or receive data stored in the memory device 613 through the card interface 620 and the memory controller 611.

Figure 12:
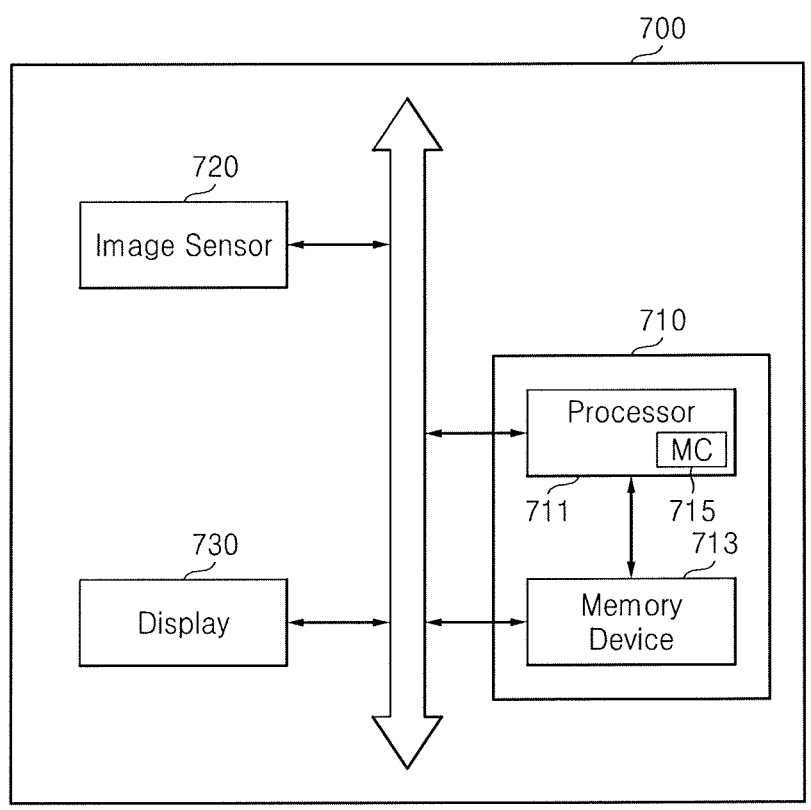
FIG. 12 is a block diagram of a system including the memory device illustrated in FIG. 1 according to an exemplary embodiment of the present inventive concept.

FIG. 12 is a block diagram of a system including the memory device illustrated in FIG. 1 according to an exemplary embodiment of the present inventive concept. Referring to FIGS. 1, 7, 8, and 12, a system 700 may be embodied in a digital camera or a portable device equipped with the digital camera. The portable device may be embodied in a smart phone, a tablet PC, a MID, a wearable computer, or the like.

The system 700 may include a processor 711 which controls an operation of the system 700, and a memory device 713. The memory device 713 may be the memory device 100 illustrated in FIG. 1. According to an exemplary embodiment of the present inventive concept, the processor 711 and the memory device 713 may be packaged in a single package 710. The package 710 may be the package 300 illustrated in FIG. 7 or the package 300' illustrated in FIG. 8.

An image sensor 720 of the system 700 may convert an optical image into a digital signal, and the converted digital signal may be stored in the memory device 713 or displayed through a display 730 under a control of the processor 711. In addition, a digital signal stored in the memory device 713 may be displayed through the display 730 under a control of the processor 711.

Figure 13:
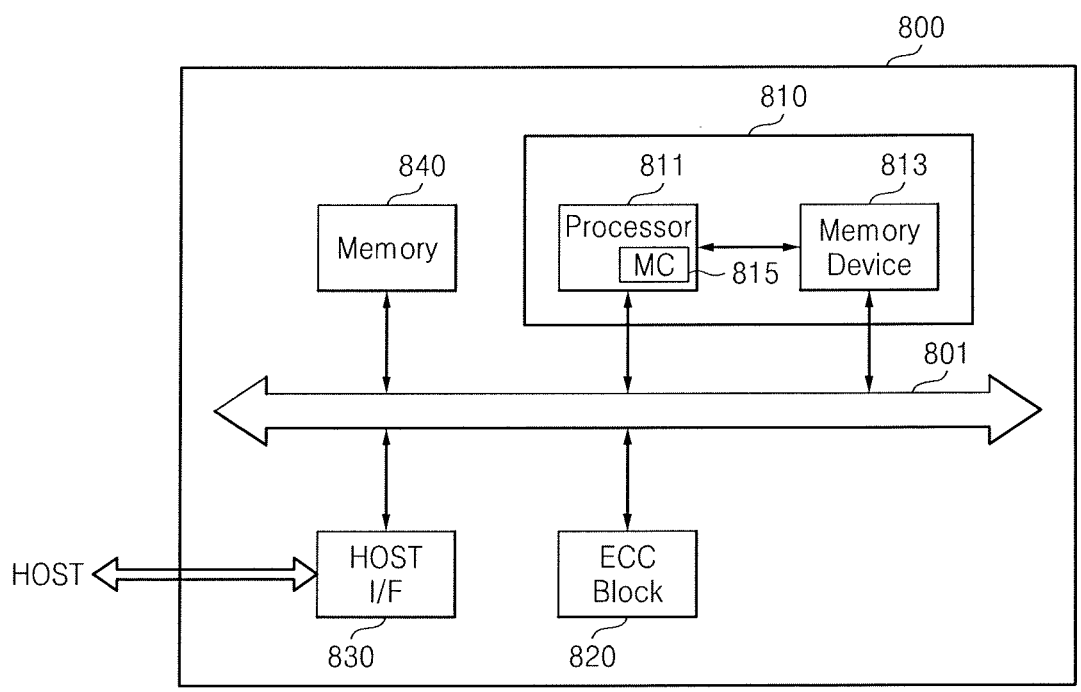
FIG. 13 is a block diagram of a system including the memory device illustrated in FIG. 1 according to an exemplary embodiment of the present inventive concept.

FIG. 13 is a block diagram of a system including the memory device illustrated in FIG. 1 according to an exemplary embodiment of the present inventive concept. Referring to FIGS. 1, 7, 8, and 13, a system 800 may include a memory device 813 and a processor 811. The processor 811 may control an operation of the system 800. The memory device 813 may be the memory device 100 illustrated in FIG. 1.

According to an exemplary embodiment of the present inventive concept, the memory device 813 and the processor 811 may be packaged into a single package 810. The package 810 may be the package 300 illustrated in FIG. 7 or the package 300' illustrated in FIG. 8.

The processor 811 may include a memory controller 815 for controlling an operation of the memory device 813. The system 800 may include a memory 840 which can be used as an operation memory of the processor 811. The memory 840 may be embodied in a volatile memory or a non-volatile memory.

A host may transmit or receive data to or from the memory device 813 through the processor 811 and the host interface 830. In this case, the memory controller 815 may perform a function of a memory interface.

According to an exemplary embodiment of the present inventive concept, the system 800 may further include an error correction code (ECC) block 820. The ECC block 820 which operates according to a control of the processor 811 may detect and correct an error included in data read by the memory device 813 through the memory controller 815.

The processor 811 may control data exchange among the ECC block 820, the host interface 830, and the memory 840 through a bus 801. The system 800 may be embodied in a USB memory drive, a memory stick, an MMC, an eMMC, a UFS, or the like.

Figure 14:
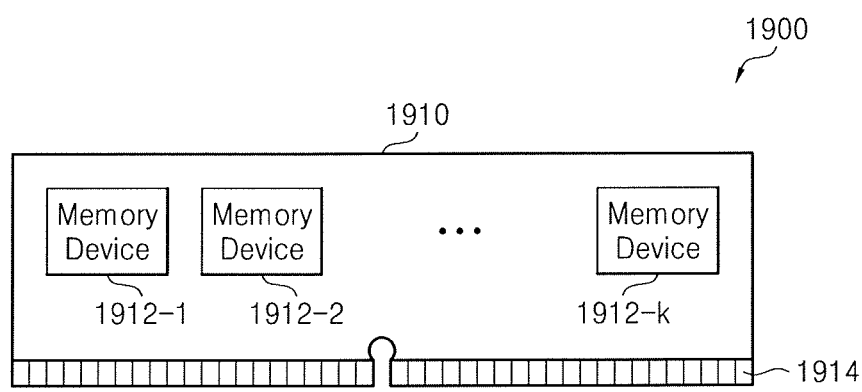
FIG. 14 is a block diagram of a system including the memory device illustrated in FIG. 1 according to an exemplary embodiment of the present inventive concept.

FIG. 14 is a block diagram of a system including the memory device illustrated in FIG. 1 according to an exemplary embodiment of the present inventive concept. Referring to FIG. 14, a system 1900, e.g., a memory module, may include a plurality of memory devices 1912-1 to 1912 k, where k is a natural number, mounted on a printed circuit board (PCB) 1910. The PCB 1910 may include a plurality of connection pins 1914.

Each of the memory devices 1912-1 to 1912-k may be the memory device 100 illustrated in FIG. 1. The memory module may be a single in-line memory module (SIMM), a dual in-line memory module (DIMM), a load reduction dual in-line memory module (LRDIMM), a Fully Buffered DIMM (FBDIMM), an unregistered DIMM (UDIMM), a registered DIMM (RDIMM), a small outline DIMM (SO-DIMM), or the like.

Figure 15:
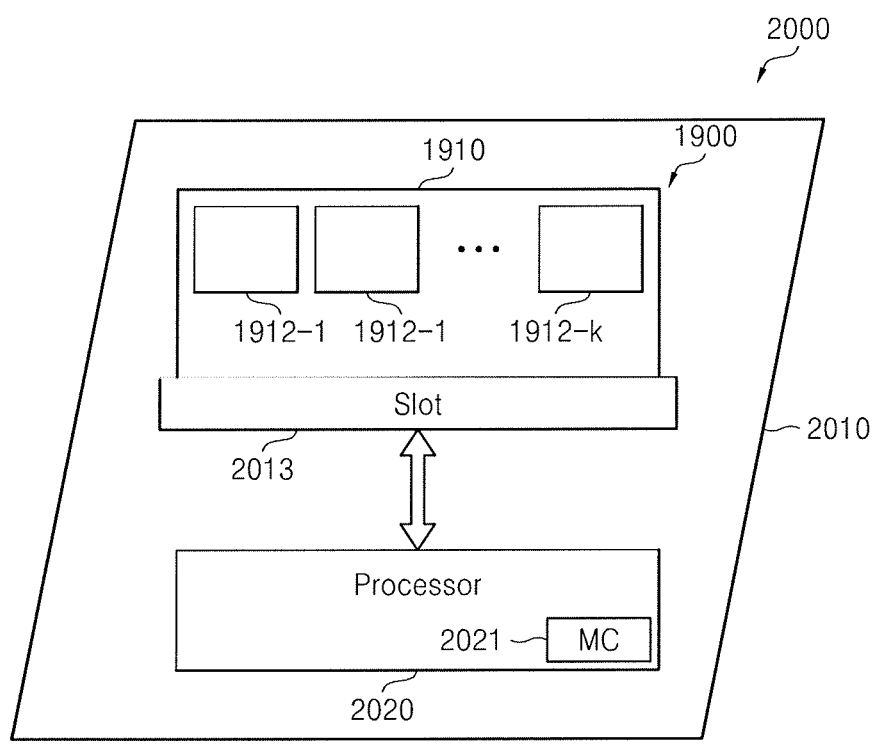
FIG. 15 is a block diagram of a system including the memory device illustrated in FIG. 1 according to an exemplary embodiment of the present inventive concept.

FIG. 15 is a block diagram of a system including the memory device illustrated in FIG. 1 according to an exemplary embodiment of the present inventive concept. Referring to FIGS. 14 and 15, a system 2000 may be embodied in a PC, a laptop computer, a server, or the like. The system 2000 includes a memory module slot 2013, mounted on a main board 2010, and a processor 2020. Each of the memory devices 1912-1 to 1912-k of a memory module 1900 may transmit or receive data to or from the processor 2020 through the memory module slot 2013 and the main board 2010. Each of the memory devices 1912-1 to 1912-k may be the memory device 100 illustrated in FIG. 1. For example, the processor 2020 may be a chip set. The processor 2020 may include a memory controller 2021 for controlling the memory devices 1912-1 to 1912-k. According to an exemplary embodiment of the present inventive concept, each of the memory devices 1912-1 to 1912-k may be a memory package.

Figure 16:
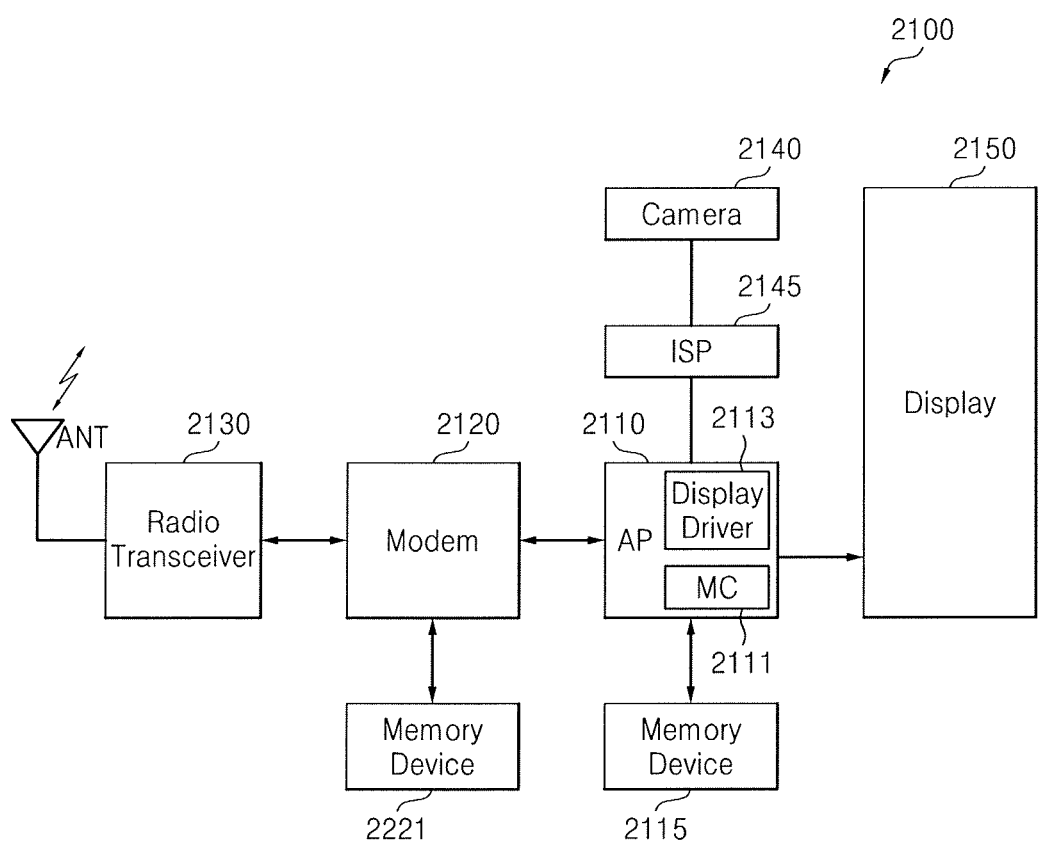
FIG. 16 is a block diagram of a system including the memory device illustrated in FIG. 1 according to an exemplary embodiment of the present inventive concept.

FIG. 16 is a block diagram of a system including the memory device illustrated in FIG. 1 according to an exemplary embodiment of the present inventive concept. As illustrated in FIG. 16, a system 2100 may be embodied in a mobile computing device. The mobile computing device may be embodied in a laptop computer, a mobile phone, a smart phone, a tablet PC, a PDA, an EDA, a digital still camera, a PMP, a PND, a portable game console, a MID, an e-book, or the like.

An application processor (AP) 2110, e.g., a mobile application processor 2110, may control an operation of each of elements 2115, 2120, 2145, and 2150. Each of memory devices 2115 and 2221 may be the memory device 100 illustrated in FIG. 1. The memory controller 2111 embodied inside the AP 2110 may control an access operation to the memory device 2115.

A display driver 2113 embodied inside the AP 2110 may control an operation of a display 2150. The display 2150 may be embodied in a thin film transistor liquid crystal display (TFT-LCD), a light-emitting diode (LED) display, an organic LED (OLED) display, an active-matrix OLED (AMOLED) display, a flexible display, or the like.

A modem 2120 may control the transmission and reception of data between a radio transceiver 2130 and the AP 2110. Data processed by the modem 2120 may be stored in the memory device 2221 or transmitted to the AP 2110.

Radio data received through an antenna ANT is transmitted to the modem 2120 through the radio transceiver 2130, data output from the modem 2120 is converted into radio data by the radio transceiver 2130, and the converted radio data is output through the antenna ANT.

The image signal processor (ISP) 2145 may process a signal output from a camera or an image sensor 2140, and transmit the processed data to the AP 2110. The AP 2110 may control the performance of at least one of a web browsing, an e-mail access, a video playback, a document editing, and an image editing.

Figure 17:
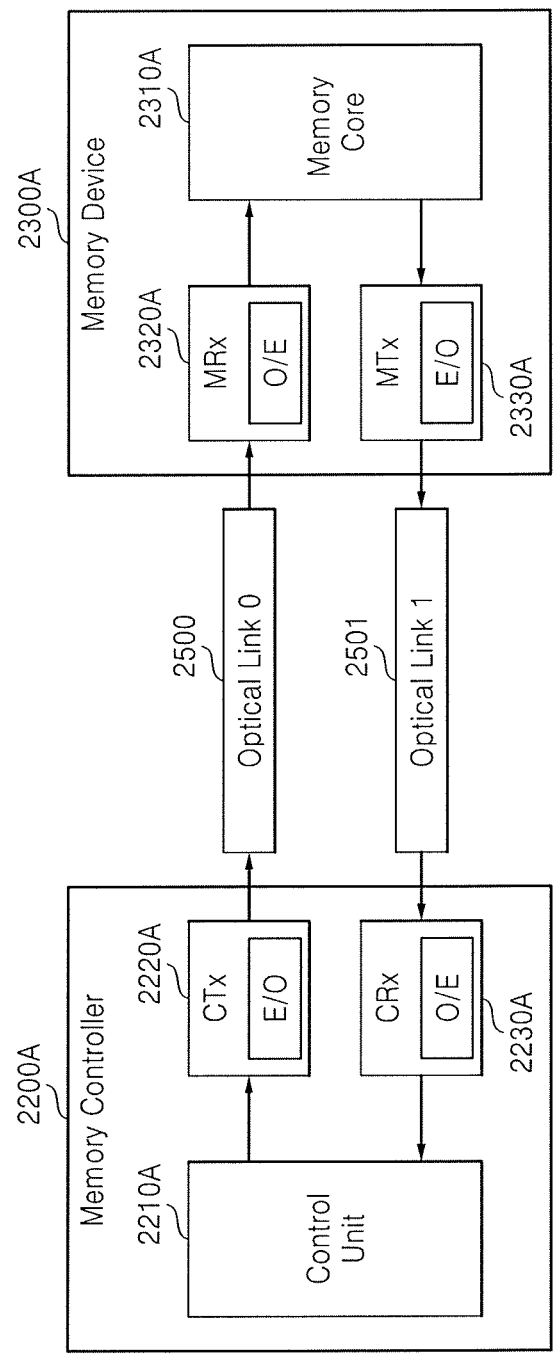
FIG. 17 is a block diagram of a system including the memory device illustrated in FIG. 1 according to an exemplary embodiment of the present inventive concept.

FIG. 17 is a block diagram of a memory system including the memory device illustrated in FIG. 1 according to an exemplary embodiment of the present inventive concept. Referring to FIG. 17, a memory system includes a memory controller 2200A and a memory device 2300A. The memory controller 2200A includes a control unit 2210A, an optical transmitter 2220A which includes an electrical-to-optical (E/O) conversion device for converting an electrical signal into an optical signal, and an optical receiver 2230A which includes an optical-to-electrical (0/E) conversion device for converting an optical signal into an electrical signal.

The memory device 2300A includes a memory core 2310A, the optical receiver 2320A which includes the optical-to-electrical (0/E) conversion element converting an optical signal into an electrical signal, and the optical transmitter 2330A which includes the electrical-to-optical (E/O) conversion device converting an electrical signal into an optical signal. For example, the memory core 2310A may include a memory cell array.

The memory device 2300A may be the memory device illustrated in FIG. 1.

An optical link 0 2500 and an optical link 1 2501 for transmitting or receiving data are connected between the memory controller 2200A and the memory device 2300A. According to an exemplary embodiment of the present inventive concept, the memory controller 2200A and the memory device 2300A may transmit or receive data through one of the optical links 2500 and 2501.

A partial chip, a system having the partial chip, and a method of operating the system according to an exemplary embodiment of the present inventive concept may perform a PBT operation by compulsorily generating data corresponding to data output from a fail region of a memory cell array. Accordingly, the partial chip, the system, and the method may reduce a test time, and thus, a test cost may be reduced due to the reduced test time.

Although a few embodiments of the present inventive concept have been shown and described with reference to exemplary embodiments thereof, it will be appreciated by those skilled in the art that various changes in forms and details may be made in these embodiments without departing from the spirit and scope of the present inventive concept as defined in the appended claims.

What is claimed is:

1. A partial chip comprising:
   a memory cell array including a pass region and a fail region; and
   a signal control circuit configured to generate second data corresponding to first data to be output from the fail region, wherein the signal control circuit is configured to bypass third data output from the pass region to a data comparison circuit in the partial chip.

2. The partial chip of claim 1, wherein the second data is generated during a parallel bit test (PBT) operation and all of the second data is set to one of a logic high and a logic low by using the signal control circuit.

3. The partial chip of claim 2, further comprising a mode register which includes information on performance of the PBT operation.

4. The partial chip of claim 1, further comprising a partial chip control circuit configured to set the pass region to be a logic high and the fail region to be a logic low.

5. The partial chip of claim 1, wherein the partial chip is a dynamic random access memory (DRAM).

6. A memory module comprising:
   a printed circuit board (PCB) including a plurality of connection pins; and
   the partial chip of claim 1 mounted on the PCB.

7. The memory module of claim 6, wherein the signal control circuit is configured to set all of the second data to be one of a logic high and a logic low during a parallel bit test (PBT) operation.

8. The memory module of claim 7, wherein the partial chip further includes a mode register including information on performance of the PBT operation, wherein the partial chip is a dynamic random access memory (DRAM), and wherein the partial chip further includes a partial chip control circuit configured to set the pass region to be the logic high and to set the fail region to be the logic low.

9. A system comprising:
   the memory module of claim 6;
   a memory module slot connected to the memory module; and
   a processor electrically connected to the memory module slot,
   wherein the processor includes a memory controller configured to control an operation of the partial chip.

10. The system of claim 9,
    wherein the signal control circuit is configured to set all of the second data to be one of a logic high and a logic low during a parallel bit test (PBT) operation.

11. The system of claim 10, wherein the partial chip further includes a mode register having information on performance of the PBT operation,
    wherein the partial chip is a dynamic random access memory (DRAM),
    wherein the partial chip further includes a partial chip control circuit configured to set the pass region to the logic high and the fail region to be the logic low.

12. A system comprising:
    the partial chip of claim 1;

a card interface; and a memory controller configured to control data exchange between the partial chip and the card interface.

13. The system of claim 12,
wherein the signal control circuit is configured to set all of the second data to be one of a logic high and a logic low during a parallel bit test (PBT) operation.

14. A system comprising:

a partial chip; and a memory controller configured to control an operation of the partial chip, wherein the partial chip includes:

a memory cell array including a pass region and a fail region; and a signal control circuit configured to generate second data corresponding to first data to be output from the fail region, wherein the signal control circuit is configured to bypass third data output from the pass region to a data comparison circuit in the system, wherein the signal control circuit is configured to set all of the second data to be one of a logic high and a logic low during a parallel bit test (PBT) operation.

15. The system of claim 14, wherein the memory controller is embodied inside an application processor.

16. The system of claim 14, wherein the system is a smart phone, a tablet personal computer, or a wearable computer.

17. A partial chip comprising:

a first bank including a pass sub block and a fail sub block;

a signal control circuit configured to generate second data corresponding to first data to be output from the fail sub block during a parallel bit test (PBT) operation, to output the generated second data to a data comparison circuit, and to bypass third data from the pass sub block to the data comparison circuit; and a data comparison circuit configured to compare the second data with third data, and to output one of the second and third data according to the comparison result to an output driver of the partial chip.

18. The partial chip of claim 17, further comprising a control logic configured to select the first bank as a bank on which the PBT operation is performed.

19. The partial chip of claim 17, further comprising a partial chip control circuit configured to set the pass sub block to be a logic high and the fail sub block to be a logic low.

* * * * *